United States Patent
Uchida et al.

(10) Patent No.: US 8,193,038 B2
(45) Date of Patent: Jun. 5, 2012

(54) METHOD FOR MANUFACTURING SEMICONDUCTOR DEVICE, SEMICONDUCTOR CHIP, AND SEMICONDUCTOR WAFER

(75) Inventors: Shinichi Uchida, Kanagawa (JP); Yoshitsugu Kawashima, Kanagawa (JP); Hiroshi Ise, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 133 days.

(21) Appl. No.: 12/801,217

(22) Filed: May 27, 2010

(65) Prior Publication Data

US 2010/0320612 A1    Dec. 23, 2010

(30) Foreign Application Priority Data

Jun. 17, 2009    (JP) ................................. 2009-144645

(51) Int. Cl.
*H01L 21/00* (2006.01)
(52) U.S. Cl. ....................................... 438/113; 438/460
(58) Field of Classification Search .......... 438/110–114, 438/460–464; 257/E21.577, E21.597
See application file for complete search history.

(56) References Cited

U.S. PATENT DOCUMENTS

| | | | | |
|---|---|---|---|---|
| 7,316,965 B2 * | 1/2008 | Hooper et al. | ................ | 438/460 |
| 7,615,469 B2 * | 11/2009 | Grivna et al. | ................ | 438/462 |
| 7,659,145 B2 * | 2/2010 | Do et al. | ...................... | 438/109 |
| 7,704,796 B2 * | 4/2010 | Pagaila et al. | ................ | 438/113 |
| 8,058,151 B2 * | 11/2011 | Jeng et al. | ..................... | 438/460 |

FOREIGN PATENT DOCUMENTS

| | | |
|---|---|---|
| JP | 05-029413 | 2/1993 |
| JP | 08-181330 | 7/1996 |
| JP | 2000-286316 | 10/2000 |
| JP | 2004-235357 | 8/2004 |

* cited by examiner

*Primary Examiner* — Cuong Q Nguyen
(74) *Attorney, Agent, or Firm* — McGinn IP Law Group, PLLC (57) ABSTRACT

A method for manufacturing a semiconductor device includes forming a semiconductor wafer including a plurality of interconnect layers, the semiconductor wafer including: a plurality of chip-composing portions; a dicing region separating the chip-composing portions from each other; and a plurality of inter-chip interconnects formed in the dicing region and electrically connecting adjacent ones of the chip-composing portions; and forming semiconductor chips by dicing the dicing region so as to divide the chip-composing portions, wherein each of the inter-chip interconnects has a width of an intermediate portion narrower than widths of connection end portions connected to the adjacent ones of the chip-composing portions.

9 Claims, 12 Drawing Sheets

METHOD FOR MANUFACTURING SEMICONDUCTOR DEVICE, SEMICONDUCTOR CHIP, AND SEMICONDUCTOR WAFER

This application is based on Japanese patent application No. 2009-144645 the content of which is incorporated hereinto by reference.

BACKGROUND

1. Technical Field

The present invention relates to a method for manufacturing a semiconductor device, a semiconductor chip, and a semiconductor wafer.

2. Related Art

Semiconductor chip is generally manufactured by forming a plurality of chip-composing portions, each of which later configures a semiconductor chip (simply referred to as "chip", hereinafter) on a single semiconductor wafer (simply referred to as "wafer", hereinafter), and then by cutting (dicing) the wafer along dicing region using a dicer, so as to separate the individual chip-composing portions from each other.

In a step preceding the separation of the individual chip-composing portions, inter-chip interconnects which connect adjacent ones of the chip-composing portions sequentially with each other may occasionally be provided, typically for the purpose of inspecting en bloc the plurality of chip-composing portions in a single wafer. Formation of the inter-chip interconnects which connect the chip-composing portions are described in Japanese Laid-Open Patent Publication Nos. 2000-286316, H08-181330 and H05-29413, for example.

SUMMARY

The inter-chip interconnects between adjacent ones of the chip-composing portions are cut in the process of dicing using the dicer. In view of facilitating the cutting of the inter-chip interconnects, in other words, in view of improving readiness in dicing, thinner inter-chip interconnects are more preferable. Too thin inter-chip interconnects may, however, increase impedance of the inter-chip interconnects, and may make desired power supply or signal transmission through the inter-chip interconnects more difficult.

As may be understood from the above, it has been difficult to suppress the impedance of the inter-chip interconnects from elevating, and to improve the readiness in dicing of the semiconductor wafer at the same time.

In one embodiment, there is provided a method for manufacturing a semiconductor device which includes:

forming a semiconductor wafer including a plurality of interconnect layers, the semiconductor wafer including:
  a plurality of chip-composing portions;
  a dicing region separating the chip-composing portions from each other; and
  a plurality of inter-chip interconnects formed in the dicing region and electrically connecting adjacent ones of the chip-composing portions; and forming semiconductor chips by dicing the dicing region so as to divide the chip-composing portions, wherein each of the inter-chip interconnects has a width of an intermediate portion narrower than widths of connection end portions connected to the adjacent ones of the chip-composing portions.

According to the method for manufacturing a semiconductor device, since each of the inter-chip interconnects is formed so as to be narrowed at the intermediate portion thereof positioned between both connection ends where the inter-chip interconnect is connected to the chip-composing portions, and since the thus-narrowed intermediate portions are cut by dicing, so that the readiness in dicing may be improved. Moreover, since the connection ends of each inter-chip interconnect connected to the chip-composing portions are formed wider than the intermediate portion, so that the impedance of each inter-chip interconnect may be suppressed from elevating, unlike the case where the entire portion of each inter-chip interconnect is narrowed.

In another embodiment, there is also provided a semiconductor chip which includes a semiconductor substrate; and a plurality of interconnect layers formed over the semiconductor substrate, wherein the semiconductor chip having an end portion of an interconnect, contained in any one of the interconnect layers, exposed to the end face of its own, and the end portion of the exposed interconnect being narrowed from a base portion of the interconnect.

In another embodiment, there is still also provided a semiconductor wafer having a plurality of interconnect layers, which includes a plurality of chip-composing portions; a dicing region separating the chip-composing portions from each other; and a plurality of inter-chip interconnects formed in the dicing region and electrically connecting adjacent ones of the chip-composing portions, wherein each of the inter-chip interconnects has a width of an intermediate portion narrower than widths of connection end portions connected to the adjacent ones of the chip-composing portions.

According to the present invention, both of suppression of elevation in the impedance of the inter-chip interconnects, and improvement in the readiness in dicing of the semiconductor wafer, may be achieved at the same time.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will now be described herein with reference to illustrative embodiments. Those skilled in the art will recognize that many alternative embodiments can be accomplished using the teachings of the present invention and that the invention is not limited to the embodiments illustrated for explanatory purposes.

The embodiments of the present invention will be explained referring to the attached drawings. Note that all similar constituents in all drawings will be given similar reference numerals or symbols, and relevant explanations will not always necessarily be repeated.

(First Embodiment)

Figure 1:
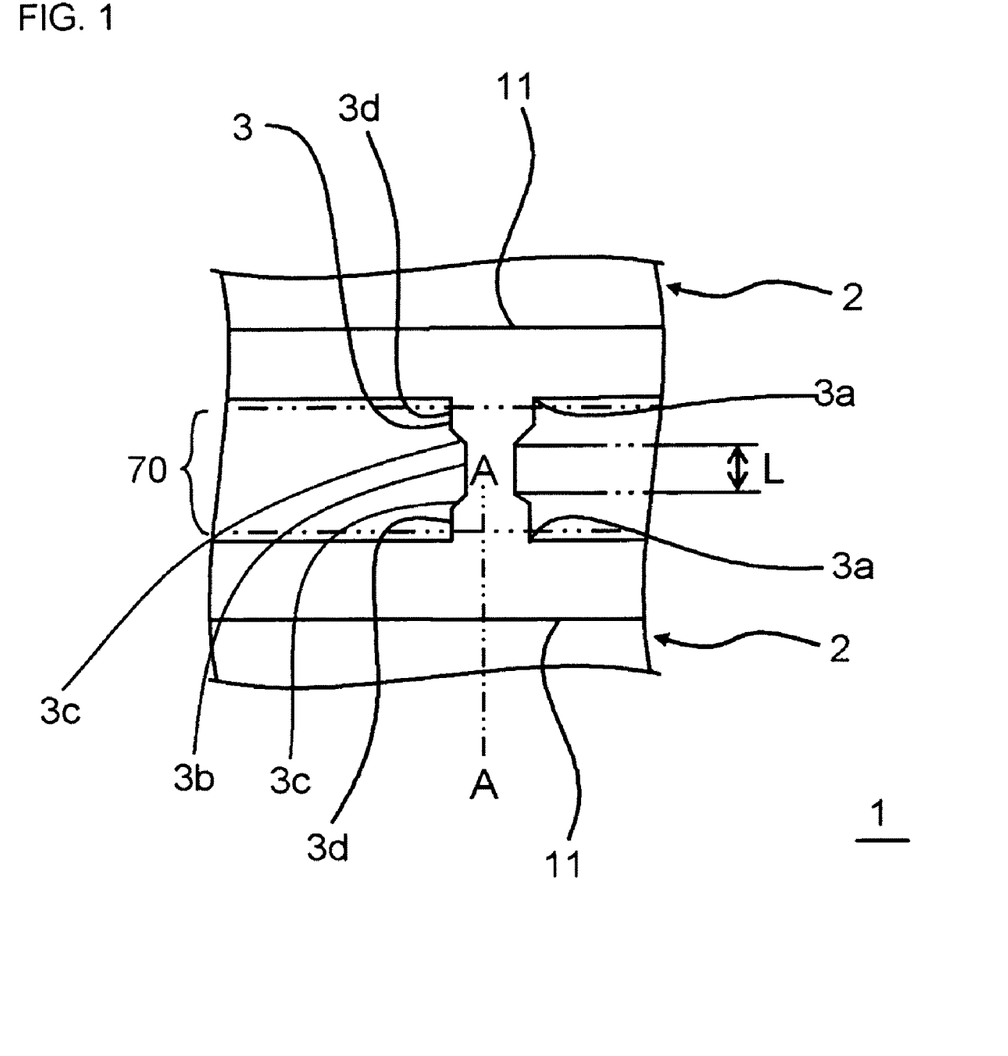
FIG. 1 is a drawing illustrating a plane structure of an essential portion of a semiconductor wafer according to a first embodiment.
Figure 2:
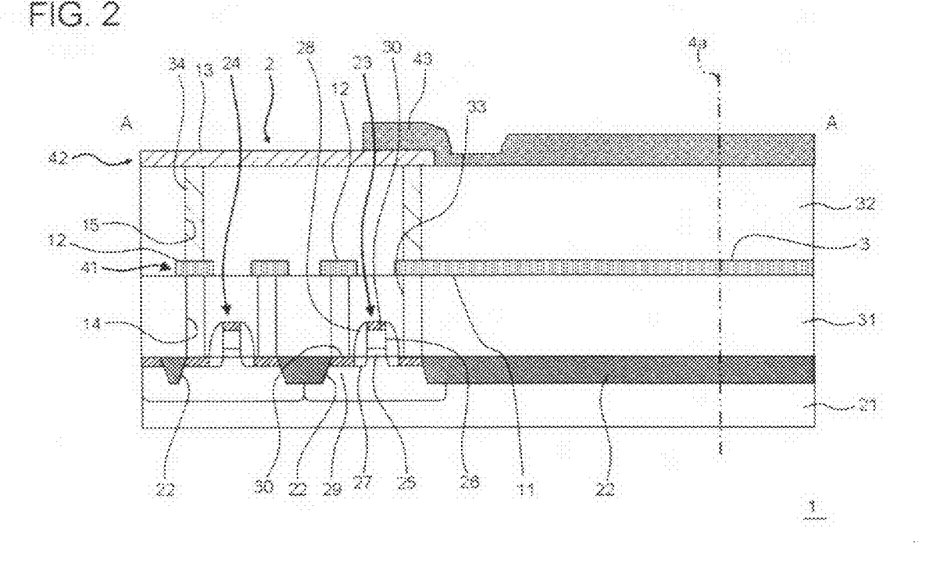
FIG. 2 is a sectional view illustrating an essential portion of the semiconductor wafer according to the first embodiment.
Figure 3:
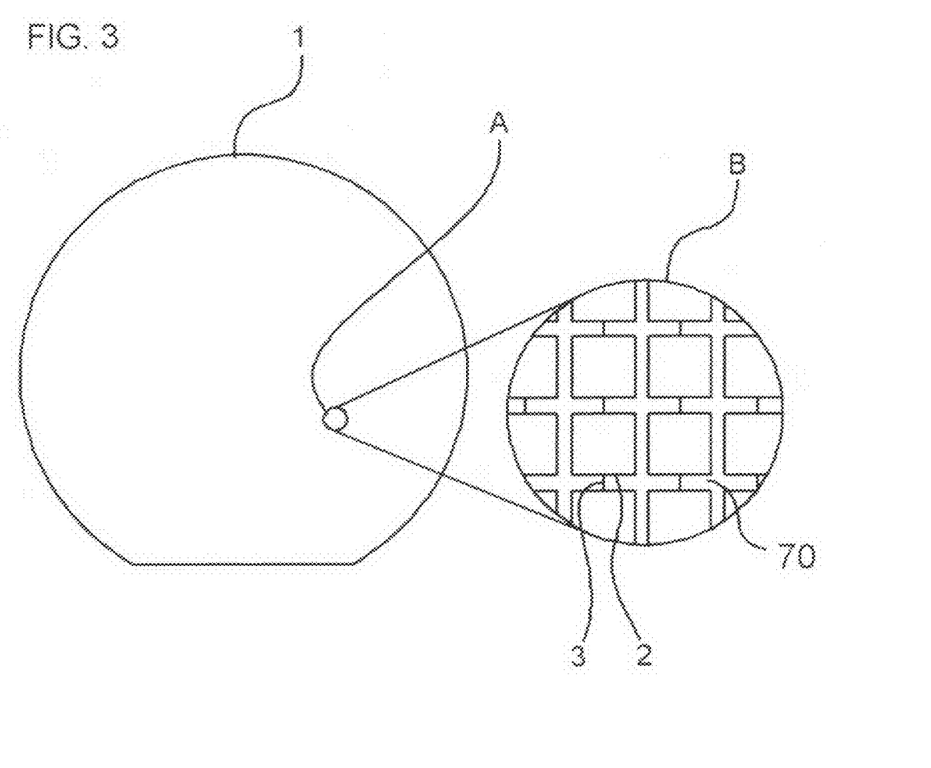
FIG. 3 is a plan view of the semiconductor wafer according to the first embodiment.
Figure 4:
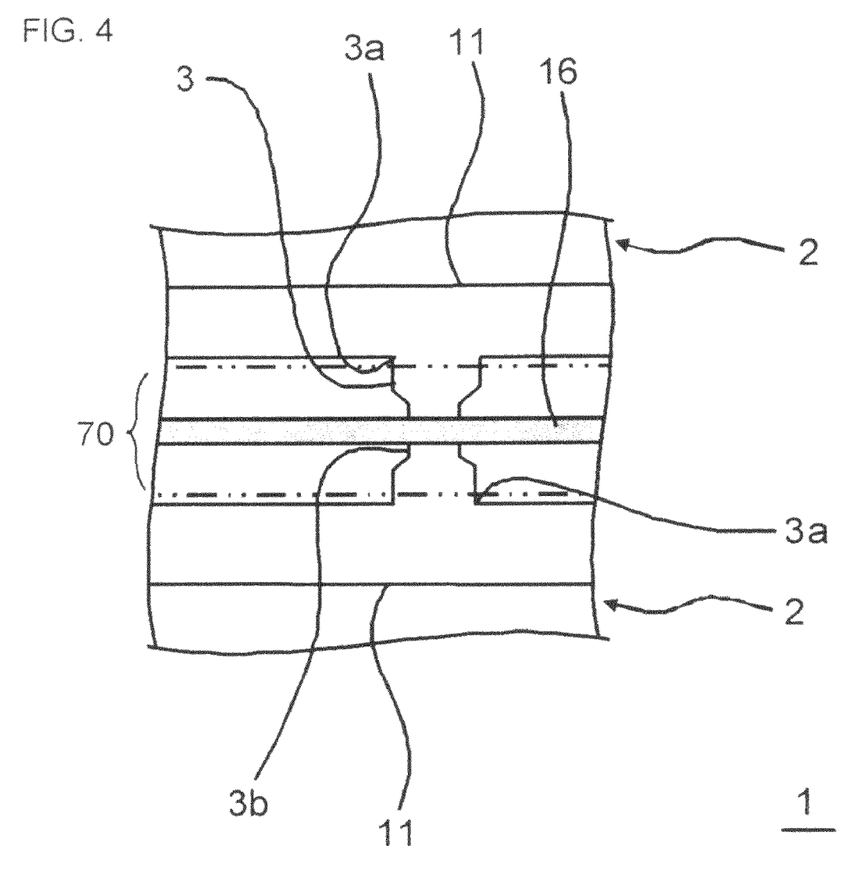
FIG. 4 is a drawing explaining operations of the first embodiment.
Figure 5:
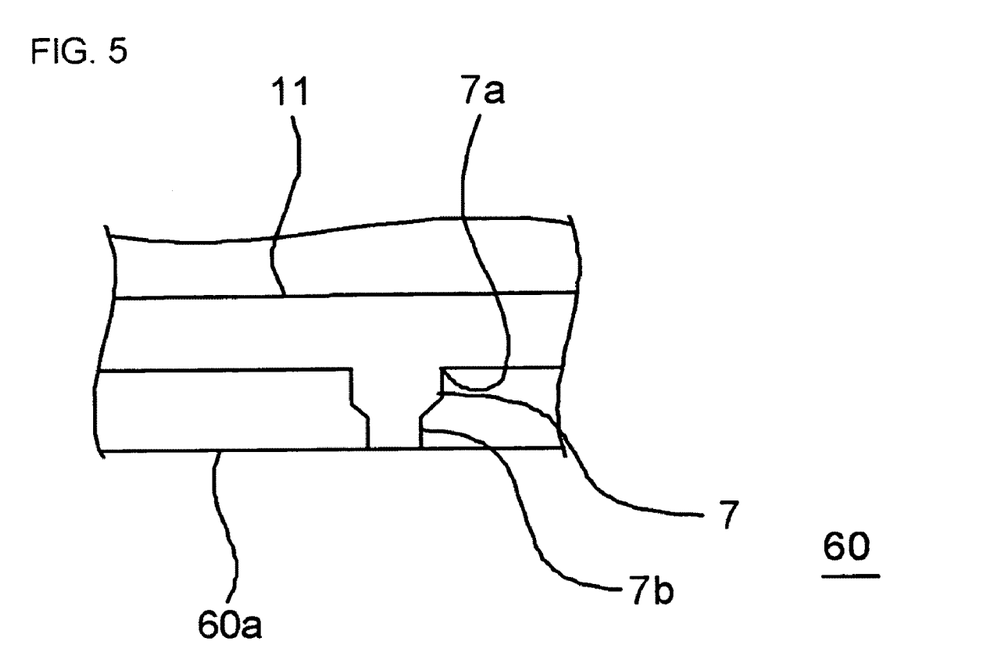
FIG. 5 is a drawing illustrating a plain structure of an end portion of a semiconductor chip according to the first embodiment.
Figure 6:
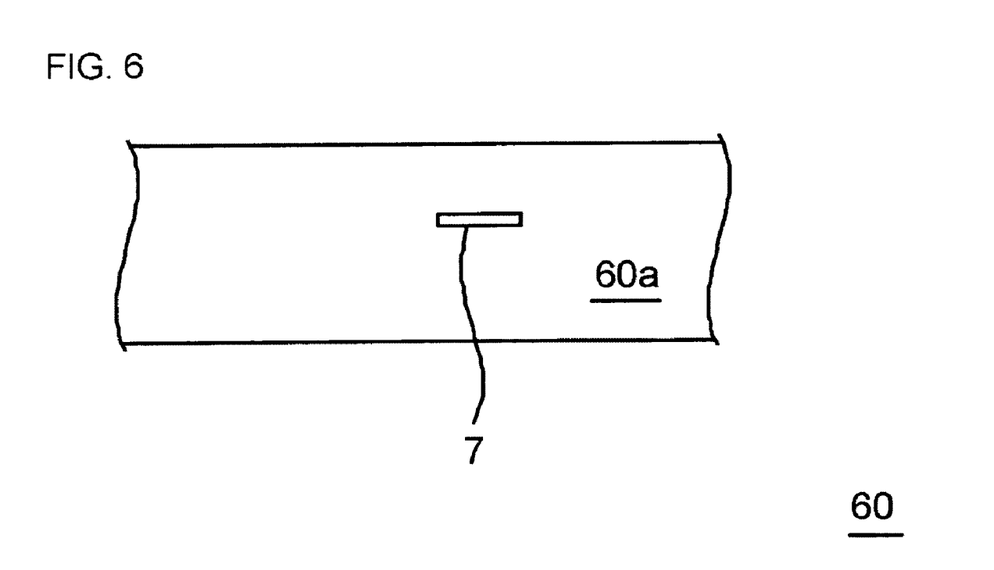
FIG. 6 is a front elevation of an end face of a semiconductor chip according to the first embodiment.

FIG. 1 and FIG. 2 are drawings illustrating an essential portion of a semiconductor wafer (simply referred to as "wafer", hereinafter) 1 according to the first embodiment. FIG. 1 illustrates a plane structure of the wafer 1. FIG. 2 illustrates a sectional view taken along line A-A in FIG. 1. FIG. 3 is a plan view of the wafer 1 according to the first embodiment, and FIG. 4 is a drawing explaining operations of the first embodiment. FIG. 5 is a drawing illustrating a plain structure of the end portion of a semiconductor chip (simply referred to as "chip", hereinafter) 60 according to the first embodiment, and FIG. 6 is a front elevation of an end face 60a of the chip 60 according to the first embodiment.

A method for manufacturing a semiconductor device according to this embodiment includes forming a semiconductor wafer 1 includes a plurality of interconnect layers (a lower interconnect layer 41 and a surficial interconnect layer 42, for example), the semiconductor wafer 1 including a plurality of chip-composing portions 2; a dicing region 70 separating the chip-composing portions 2 from each other; and a plurality of inter-chip interconnects 3 formed in the dicing region 70 and electrically connecting adjacent ones of the chip-composing portions 2; and forming semiconductor chips 60 by dicing the dicing region 70 so as to divide the chip composing portions 2, wherein each of the inter-chip interconnects 3 has a width of an intermediate portion 3b narrower than widths of connection end portions 3a connected to the adjacent ones of the chip-composing portions 2.

The chip 60 of this embodiment has a semiconductor substrate (silicon substrate 21); and a plurality of interconnect layers (the lower interconnect layer 41 and the surficial interconnect layer 42, for example) formed over the semiconductor substrate. The semiconductor chip 60 having an end portion of an interconnect 7, contained in any one of the interconnect layers (the lower interconnect layer 41, for example) is exposed to the end face of the chip 60, and the end portion 7b of the exposed interconnect 7 is narrowed from a base portion 7a of the interconnect 7.

The wafer 1 of this embodiment has a plurality of interconnect layers (the lower interconnect layer 41 and the surficial interconnect layer 42, for example). And the wafer 1 has a plurality of chip-composing portions 2; a dicing region 70 separating the chip-composing portions 2 from each other; and a plurality of inter-chip interconnects 3 formed in the dicing region 70 and electrically connecting adjacent ones of the chip-composing portions 2. Each of the inter-chip interconnects 3 has a width of an intermediate portion 3b narrower than widths of connection end portions 3a connected to the adjacent ones of the chip-composing portions 2. Details will be give below.

First of all, a configuration of the wafer 1 of this embodiment will be explained.

Portion B in FIG. 3 illustrates an enlarged view of portion A of the wafer 1. As illustrated in FIG. 3, the wafer 1 of this embodiment has a plurality of chip-composing portions 2, and inter-chip interconnects 3 each of which electrically connects adjacent ones of the chip-composing portions 2 sequentially with each other.

For more details, each inter-chip interconnect 3 electrically connects an interconnect 11 owned by the chip-composing portion 2, and another interconnect 11 owned by the adjacent chip-composing portion 2, as illustrated in FIG. 1.

As illustrated in FIG. 1, the inter-chip interconnect 3 is formed to have a constricted form such that the intermediate portion 3b thereof, positioned between both connection ends 3a where the inter-chip interconnect 3 is connected to the chip-composing portions 2, is narrowed from the connection ends 3a. By narrowing the intermediate portion 3b, the readiness in dicing may be improved.

The geometry of the inter-chip interconnect 3 will more specifically be explained. In the inter-chip interconnect 3, a transient-width portion 3 is formed between each connection end 3a and the intermediate portion 3b, so as to be gradually narrowed from the connection end 3a towards the intermediate portion 3b. In the transient-width portion 3c, the width of the inter-chip interconnect 3 linearly changes from the connection end 3a towards the intermediate portion 3b. In addition, a constant-width portion 3d having a constant width is formed between the connection end 3a and the transient-width portion 3c. The constant-width portion 3d is formed to have the same width with the connection end 3a.

The inter-chip interconnect 3 and the interconnect 11 are typically provided as power lines through which source voltage is supplied. In general, the power line is made wider than signal lines. For this reason, the readiness in dicing will be degraded for the case where the inter-chip interconnect 3 is configured by the power line, unlike the case where the inter-chip interconnect 3 is configured by the signal line.

The inter-chip interconnect 3 and the interconnect 11 are typically composed of a metal such as aluminum (Al).

The line width (width) of the intermediate portion 3b of the inter-chip interconnect 3 is set narrower, for example, by 5 μm or more, as compared with the width of the connection end 3a. The width of the connection end 3a of the inter-chip interconnect 3 may be adjusted, for example, equal to or larger than 65 μm and equal to or smaller than 80 μm, and the width of the intermediate portion 3b is adjusted, for example, equal to or larger than 40 μm and equal to or smaller than 60 μm.

Each dicing region 70 herein extends across the inter-chip interconnects 3, between adjacent ones of the chip-composing portions 2. By cutting (dicing) the wafer 1 along the dicing region 70 using a dicer (not illustrated), the chip-composing portions 2 are separated from each other, to thereby produce chips 60 (FIG. 5). The width of blade of a dicer (not illustrated) is typically 20 μm to 30 μm or around. Considering the width of blade, the length of the intermediate portion 3b, that is, length L of the intermediate portion 3b in the direction orthogonal to the longitudinal direction of the dicing region 70 is typically adjusted to at least 30 μm or larger. Each intermediate portion 3b is positioned at the center of a width of the dicing region 70. In FIG. 2, the region on the right of the boundary line 4a represents the dicing region 70.

As illustrated in FIG. 2, the wafer 1 has a plurality of interconnect layers (the lower interconnect layer 41 and the surficial interconnect layer 42, for example). The inter-chip interconnect 3 is formed typically in the second or deeper interconnect layer among the plurality of interconnect layers, counted from the most surficial interconnect layer. In a specific case exemplified in FIG. 2, the inter-chip interconnect 3 is formed in the lower interconnect layer 41, which is the second layer counted from the topmost surficial interconnect layer 42. In general in the chip-composing portion 2, the interconnect in the level of depth more closer to the surface is made thicker. Accordingly, the dicing may further be facilitated if the inter-chip interconnect 3 is formed by the interconnect in a more deeper level.

A more detailed exemplary configuration of the wafer 1 will be explained below, referring to FIG. 2. The wafer 1 typically has a silicon substrate 21. On the silicon substrate 21, device isolation regions 22 having the STI (Shallow Trench Isolation) structure, a pMOS transistor 23, and an nMOS transistor 24 are formed.

Each of the pMOS transistor 23 and the nMOS transistor 24 has a gate insulating film 25, a gate electrode 26, extension regions 27, sidewalls 28, source-drain diffusion regions 29, and silicide layers 30 respectively formed on the gate electrode 26 and the source-drain diffusion regions 29.

The wafer 1 further has a first insulating interlayer 31 which covers the device isolation regions 22, the pMOS transistor 23 and the nMOS transistor 24; the lower interconnect layer 41 which includes the inter-chip interconnect 3; a second insulating interlayer 32 which covers the lower interconnect layer 41; the surficial interconnect layer 42 formed on the second insulating interlayer 32; and a passivation film 43. The lower interconnect layer 41 contains the interconnect 11 and interconnects 12, besides the inter-chip interconnect 3. The interconnects 12 and the silicide layers 30 formed on the source-drain diffusion regions 29 are electrically connected with each other, through contact plugs 33 provided in the first insulating interlayer 31 so as to extend therethrough. The surficial interconnect layer 42 contains a surficial interconnect 13. The surficial interconnect 13 and the interconnect 12 are electrically connected with each other through a via 34 which extends through the second insulating interlayer 32.

In the wafer 1 thus configured, the region on the left from the interconnect 11 in FIG. 2 configures the chip-composing portion 2.

Next, a method for manufacturing a semiconductor device according to this embodiment will be explained.

The method for manufacturing a semiconductor device of this embodiment includes a step of manufacturing the wafer 1 configured as described in the above, and a step of dicing the wafer 1 along the dicing region 70 (FIG. 1) to separate the chip-composing portions 2 from each other, to thereby produce the chips 60.

First, the pMOS transistor 23 and the nMOS transistor 24 are fabricated on the silicon substrate 21, according to a general CMOS (Complementary Metal Oxide Semiconductor) manufacturing process. More specifically, the pMOS transistor 23 and the nMOS transistor 24 are fabricated by forming the device isolation regions 22, the gate insulating film 25, the gate electrodes 26, the extension regions 27, the sidewalls 28, the source-drain diffusion regions 29 and the silicide layers 30 on the silicon substrate 21.

Next, the first insulating interlayer 31 is formed so as to cover the device isolation regions 22, the pMOS transistor 23 and the nMOS transistor 24. Next, the contact holes 14 are formed in the first insulating interlayer 31, at positions corresponded to the source-drain diffusion regions 29, and the contact plugs 33 are formed in the contact holes 14.

Next, the lower interconnect layer 41 which contains the inter-chip interconnects 3, the interconnect 11 and the interconnects 12 are formed en bloc using a metal (Al, for example). The interconnects 12 herein are arranged so as to electrically contact with the contact plugs 33. The lower interconnect layer 41 may be formed typically by forming a metal film over the first insulating interlayer 31 and the contact plugs 33, forming thereon a mask pattern by photolithography, etching the metal film through the mask pattern, and then removing the mask pattern.

The inter-chip interconnect 3 herein is formed to have a constricted form such that the intermediate portion 3b thereof, positioned between both connection ends 3a where the inter-chip interconnect 3 is connected to the chip-composing portions 2, is narrowed from the connection ends 3a, as can be seen in the plane geometry illustrated in FIG. 1. The width of the intermediate portion 3b is made narrower, for example, by 5 μm or more, as compared with the width of the connection end 3a. The width of the connection end 3a is typically adjusted equal to or larger than 65 μm and equal to or smaller than 80 μm, and the width of the intermediate portion 3b is typically adjusted equal to or larger than 40 μm and equal to or smaller than 60 μm. Length L of the intermediate portion 3b (FIG. 1) is typically adjusted to at least 30 μm or larger. The intermediate portion 3b is positioned at the center of the width of the dicing region 70.

Next, the second insulating interlayer 32 is formed over the first insulating interlayer 31, so as to cover the inter-chip interconnect 3, the interconnect 11 and the interconnects 12. Next, via holes 15 are formed in the second insulating interlayer 32 at positions corresponded to the predetermined interconnects 12, and the vias 34 are then formed in the via holes 15.

Next, the surficial interconnect layer 42 which contains the surficial interconnect 13 is formed en bloc over the second insulating interlayer 32, using a metal (Al, for example). The surficial interconnect layer 42 may be formed typically by forming a metal film over the second insulating interlayer 32 and the vias 34, forming thereon a mask pattern by photolithography, etching the metal film through the mask pattern, and then removing the mask pattern.

Next, a passivation film 43 is formed so as to cover a part of the surficial interconnect 13.

By these processes, the wafer 1 is given in the state illustrated in FIG. 2. In this state, the wafer 1 has a plurality of chip-composing portions 2 formed thereon. Adjacent ones of the chip-composing portions 2 are electrically connected with each other sequentially through the inter-chip interconnect 3.

As described in the above, the inter-chip interconnect 3 and the interconnect 11 are typically given as the power line. At this stage where the chip-composing portions 2 are thus formed on the wafer 1, the chip-composing portions 2 may be inspected by supplying en bloc source voltage to the interconnects 11 of the individual chip-composing portions 2 on the wafer 1, sequentially through the inter-chip interconnects 3. The inter-chip interconnect 3 herein is narrowed as described in the above at the intermediate portion 3b for the purpose of improving the readiness in dicing, whereas the connection ends 3a are widened in the width as compared with the intermediate portion 3b. The impedance of the inter-chip interconnect 3 may therefore be suppressed from elevating, unlike the case where also the connection ends 3a are narrowed (in other words, where the entire portion of the inter-chip interconnect 3 is formed to have a narrow width). Accordingly, a desired level of source voltage may efficiently be supplied through the inter-chip interconnect 3.

The wafer 1 is then diced. More specifically, the wafer 1 is diced using a dicer (not illustrated), along the dicing region 70 which extend across the inter-chip interconnects 3, between adjacent ones of the chip-composing portions 2, to thereby separate the chip-composing portions 2 from each other, to produce the chips 60.

A dicing street 16 illustrated in FIG. 4 represents a passageway of the dicing blade (not illustrated) of the dicer in the process of dicing. The dicing street 16 is typically positioned at the center of the width of the dicing region 70. The wafer 1 is diced on the dicing street 16, and thereby the chip-composing portions 2 on both sides of the dicing street 16 are separated from each other. Since the dicing blade typically has a width of 20 μm to 30 μm or around, also the width of the dicing street 16 will have a width equivalent thereto.

As described in the above, the intermediate portion 3b of the inter-chip interconnect 3 is narrowed in the width as compared with the connection ends 3a. As a consequence, by dicing the wafer 1 so that the dicing street 16 runs across the inter-chip interconnects 3 at the intermediate portion 3b thereof, as illustrated in FIG. 4, the inter-chip interconnects 3 may readily be cut.

In this way, according to this embodiment, both of suppression of elevation in the impedance of the inter-chip interconnects 3, and improvement in the readiness in dicing of the wafer 1, may be achieved at the same time.

Next, a configuration of the thus-separated chip 60 obtained by the dicing will be explained, referring to FIG. 5 and FIG. 6. FIG. 5 is a drawing illustrating a plane structure of the end portion of the separated chip 60, and FIG. 6 is a schematic front elevation of the end face 60a of the separated chip 60.

As illustrated in FIG. 6, the end face 60a of the chip 60 separated by dicing has the interconnect 7 exposed therein. The interconnect 7 had been used, before the separation, as the inter-chip interconnect 3 for electrically connecting one chip-composing portion 2, later given as the chip 60, with another chip-composing portion 2 adjacent to the illustrated chip-composing portion 2. As illustrated in FIG. 5, the interconnect 7 is narrowed in the end portion 7b thereof, as compared with the base portions 7a.

According to the method for manufacturing a semiconductor device of the first embodiment, since the inter-chip interconnect 3 is formed so as to be narrowed at the intermediate portion 3b thereof, as compared with the connection ends 3a where the inter-chip interconnect 3 is connected to the chip-composing portions 2, so that dicing of the wafer 1, which is effected on such narrowed intermediate portions 3b, may be improved in readiness. Also since the connection ends 3a of the inter-chip interconnect 3 with respect to the chip-composing portions 2 is formed so as to be widened as compared with the intermediate portion 3b, so that the impedance of the inter-chip interconnect 3 may therefore be suppressed from elevating, unlike the case where the entire portion of the inter-chip interconnect 3 is formed to have a narrow width. In short, both of suppression of elevation in the impedance of the inter-chip interconnects 3, and improvement in the readiness in dicing of the wafer 1, may be achieved at the same time.

As judged from the appearance of the chip 60 of the first embodiment, having the interconnect 7 exposed to the end face 60a thereof, it is highly probable that the chip-composing portion 2 before the dicing (in a stage where the chip 60 was still a constituent of the wafer 1 corresponded to one chip-composing portion 2) had been electrically connected with the adjacent chip-composing portion 2 through the interconnect 7. Since the interconnect 7 is narrowed at the end portion 7b thereof, as compared with the base portions 7a, it is supposed that the narrowed portion was cut by dicing, and thereby the chip-composing portion 2 and adjacent ones of the chip-composing portion 2 were separated from each other. It may therefore be said that the readiness in dicing of the wafer 1 was improved. In addition, since the base portion 7a of the interconnect 7 is widened as compared with the end portion 7b, it is supposed that the impedance of the interconnect 7 had successfully been suppressed from elevating, as compared with the case where the entire portion of the interconnect 7 is formed to have a narrow width.

According to the wafer 1 of the first embodiment, since the intermediate portion 3b of the inter-chip interconnect 3 is formed so as to be narrowed as compared with the connection end 3a thereof with respect to the chip-composing portion 2, so that dicing of the wafer 1, which is effected on such narrowed intermediate portions 3b, may be improved in readiness. Also since the connection ends 3a of the inter-chip interconnect 3 with respect to the chip-composing portions 2 is formed so as to be widened as compared with the intermediate portion 3b, so that the impedance of the inter-chip interconnect 3 may therefore be suppressed from elevating, unlike the case where the entire portion of the inter-chip interconnect 3 is formed to have a narrow width.

The inter-chip interconnect 3 is typically provided as a power line, and electrically connects the interconnects 11, which are power lines of adjacent ones of the chip-composing portions 2, sequentially with each other. In general, the power line is made wider than signal lines. For this reason, the readiness in dicing will be degraded for the case where the inter-chip interconnect 3 is configured by the power line, unlike the case where it is configured by the signal line. In this case, the inter-chip interconnect 3 may more readily be diced, if it is narrowed in the intermediate portion 3b as described in the above. Accordingly, it may be said that effect of narrowing of the intermediate portion 3b may be larger for the case where the inter-chip interconnect 3 is given as a power line, as compared with the case where the inter-chip interconnect 3 is given as a signal line.

Interconnects composed of Al has larger resistivity than interconnects composed of Cu and so forth. It is, therefore, necessary for the Al interconnect to be formed wider than the Cu or other Cu interconnects, if the same amount of current is desired to flow therethrough. On the other hand, there is a contradictory demand for narrowing of the intermediate portion 3b, since the wider the interconnect will be, the poorer the readiness in dicing will be. In other words, an effect of narrowing of the intermediate portion 3b may be more distinctive, for the case where the inter-chip interconnect 3 is composed of Al.

By forming the inter-chip interconnect 3 typically in the second or deeper interconnect layer among the plurality of interconnect layers, counted from the most surficial interconnect layer, the inter-chip interconnect 3 may be arranged away from the surficial portion of the chip-composing portion 2 (or may be arranged in a lower layer). Since the interconnects in the chip-composing portion 2 is generally formed so that those more closer to the surface are made more thicker as described in the above, so that the dicing may further be facilitated if the inter-chip interconnect 3 is formed by the interconnect in a more deeper level, or, if the inter-chip interconnect 3 is made thinner than the surficial interconnects.

Figure 7:
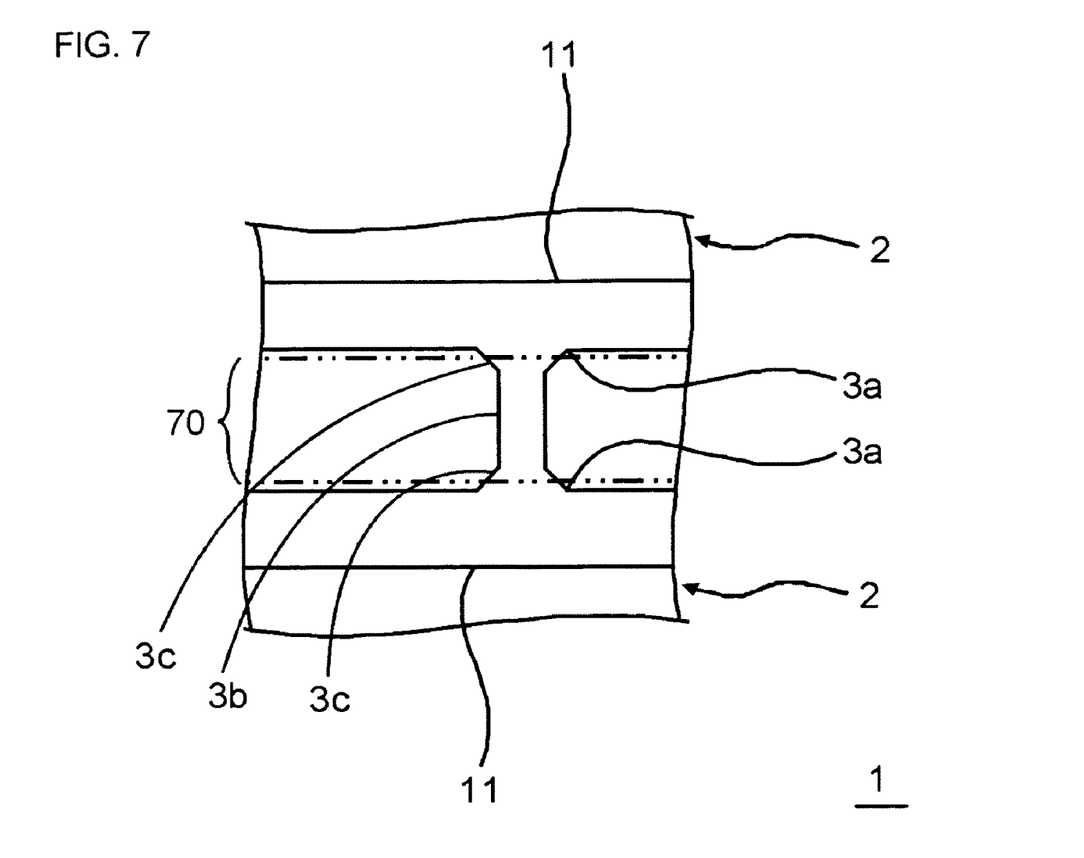
FIG. 7 to FIG. 12 are drawings illustrating plain structures of essential portions of semiconductor wafers according to first to sixth modified examples, respectively.

While the first embodiment described in the above dealt with an exemplary case where the inter-chip interconnect 3 has the constant-width portion 3d between the transient-width portion 3c and the connection ends 3a as illustrated in FIG. 1, the inter-chip interconnect 3 may alternatively be configured to have no constant-width portion 3d between the transient-width portion 3c and the connection end 3a. For example, as seen in a first modified example illustrated in FIG. 7, one end of the transient-width portion 3c may configure the connection end 3a.

Figure 8:
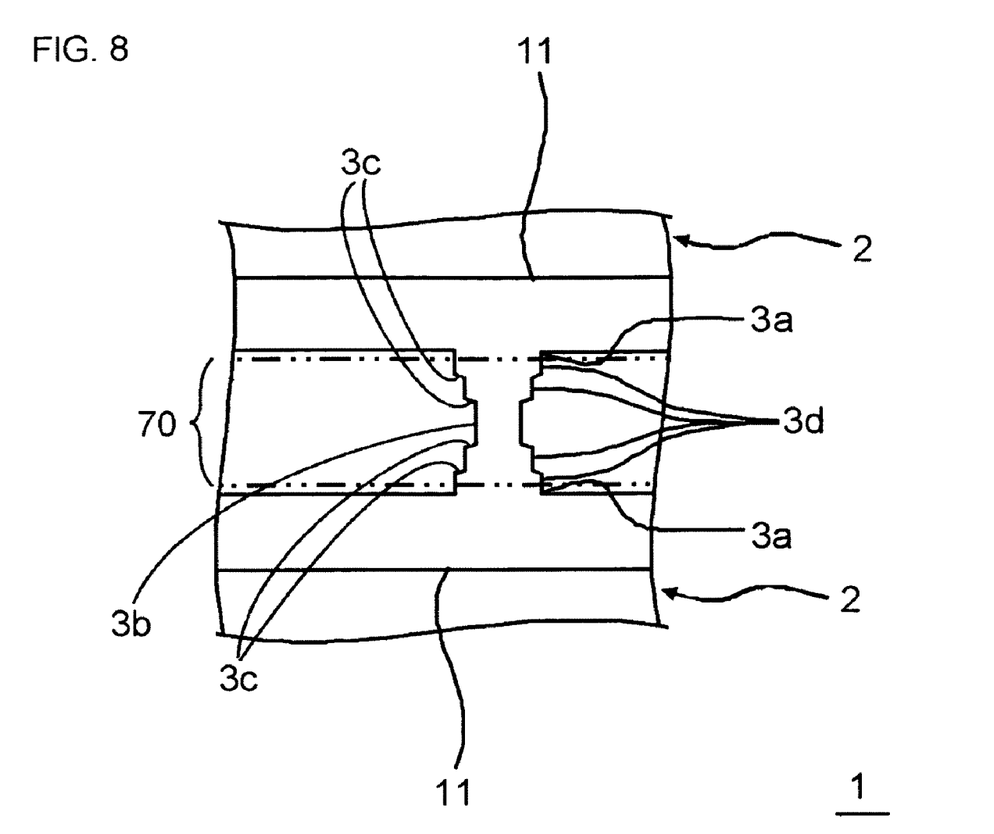

While the first embodiment described in the above dealt with an exemplary case where the inter-chip interconnect 3 has one transient-width portion 3c between one of the connection ends 3a and the intermediate portion 3b, the inter-chip interconnect 3 may alternatively have a plurality of transient-width portions 3c between one of the connection ends 3a and the intermediate portion 3b. For example, as seen in a second modified example illustrated in FIG. 8, the inter-chip interconnect 3 may have two transient-width portions 3c between one of the connection ends 3a and the intermediate portion 3b. In association therewith, typically as illustrated in FIG. 8, the inter-chip interconnect 3 may have a plurality of constant-width portions 3d between one of the connection ends 3a and the intermediate portion 3b.

Figure 9:
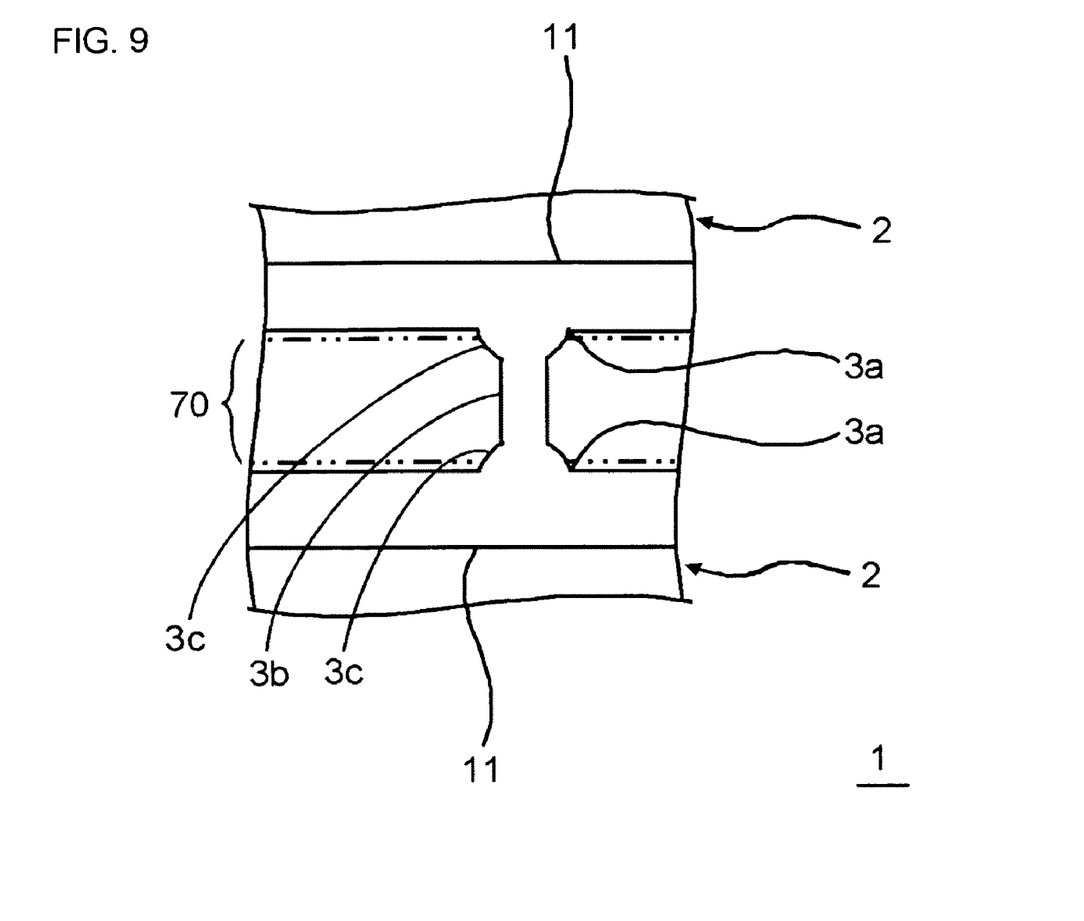
Figure 10:
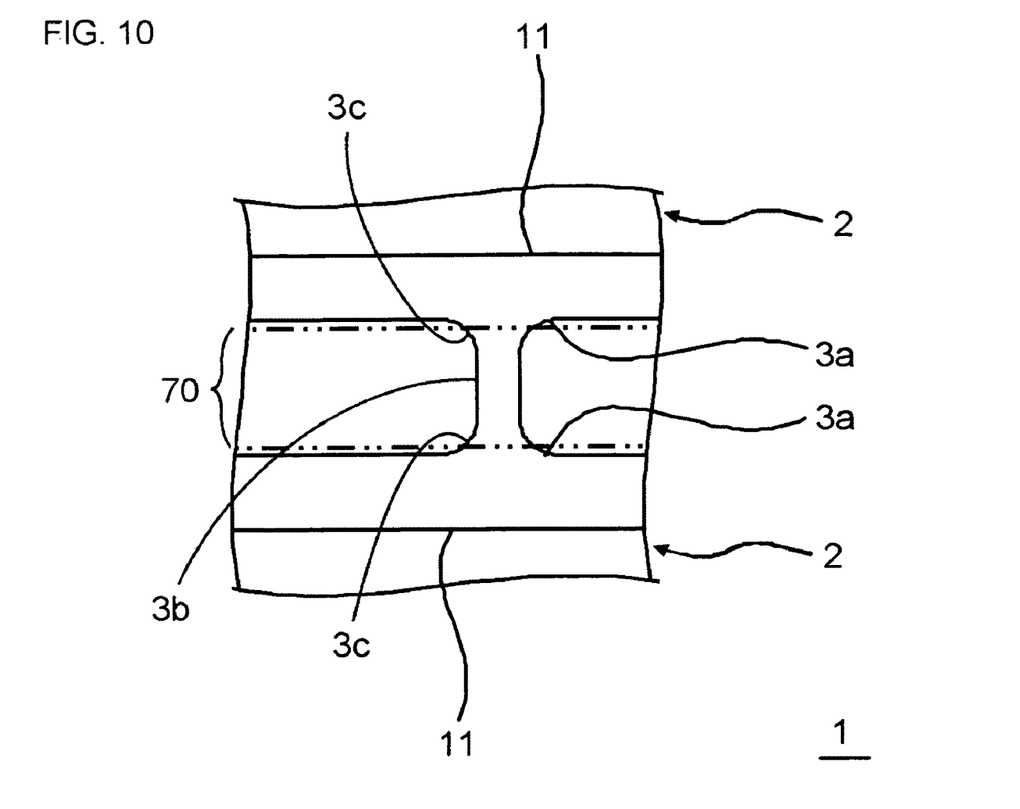

While the examples explained in the above dealt with the cases where the width of the inter-chip interconnect 3 linearly (straightly) varies in the transient-width portion 3c, the width of the inter-chip interconnect 3 may alternatively vary in a curved manner in the transient-width portion 3c, typically as illustrated in FIG. 9 and FIG. 10. In a third modified example illustrated in FIG. 9, the amount of change (ratio of change) in the width of the inter-chip interconnect 3 in the transient-width portion 3c gradually increases from the connection end 3a towards the intermediate portion 3b. Alternatively in a fourth modified example illustrated in FIG. 10, the amount of change (ratio of change) in the width of the inter-chip interconnect 3 in the transient-width portion 3c gradually decreases from the connection end 3a towards the intermediate portion 3b.

Figure 11:
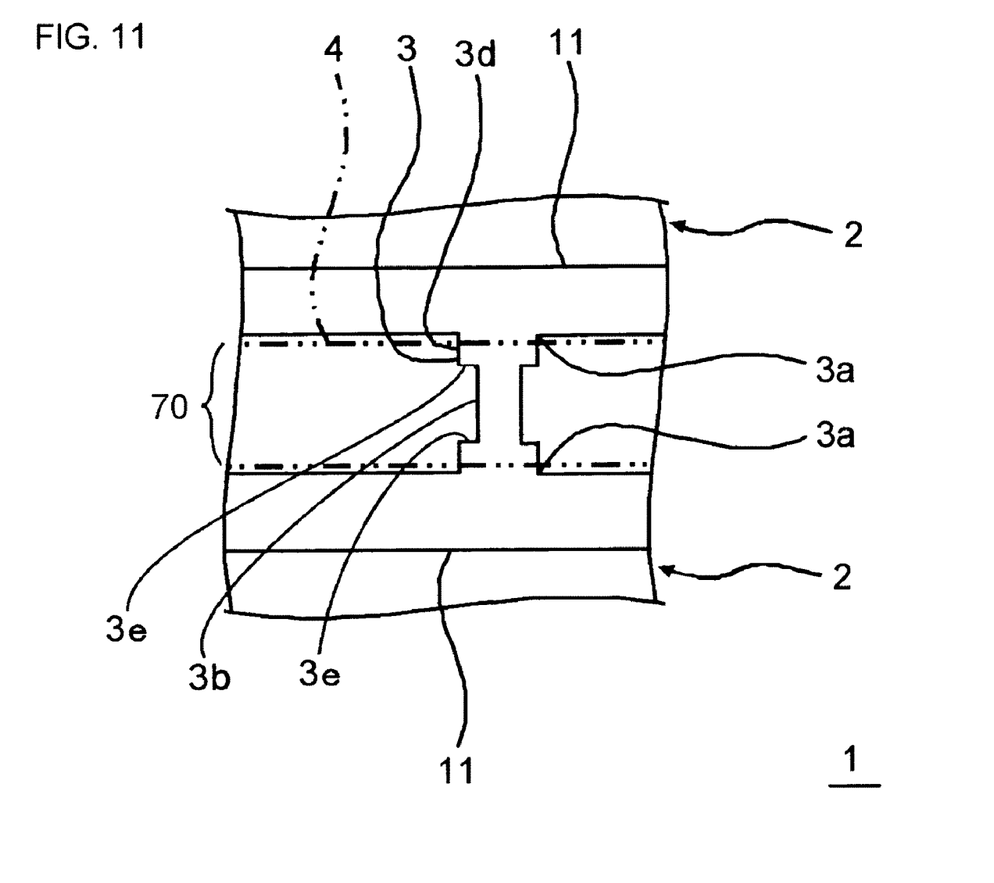

While the examples explained in the above dealt with the cases where the inter-chip interconnect 3 has the transient-width portions 3c (the gradually narrowed portions from each connection end 3a towards the intermediate portion 3b), the inter-chip interconnect 3 may have stepped portions 3e, in place of the transient-width portions 3c, typically in a fifth modified example illustrated in FIG. 11.

Figure 12:
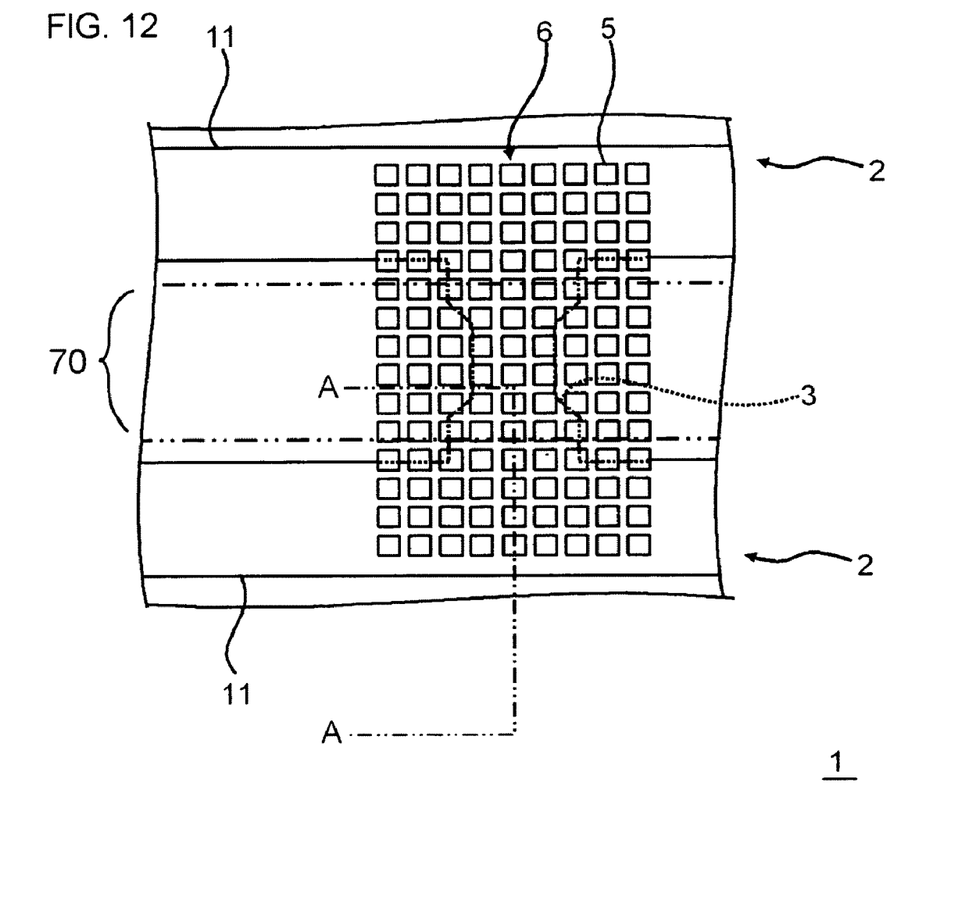
Figure 13:
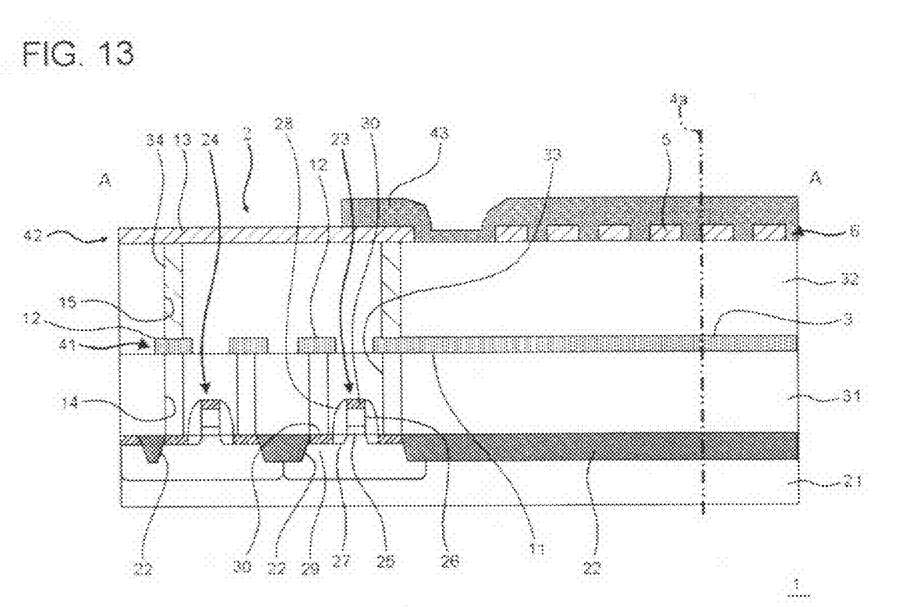
FIG. 13 is a sectional view illustrating an essential portion of the semiconductor wafer according to the sixth modified example.
Figure 14:
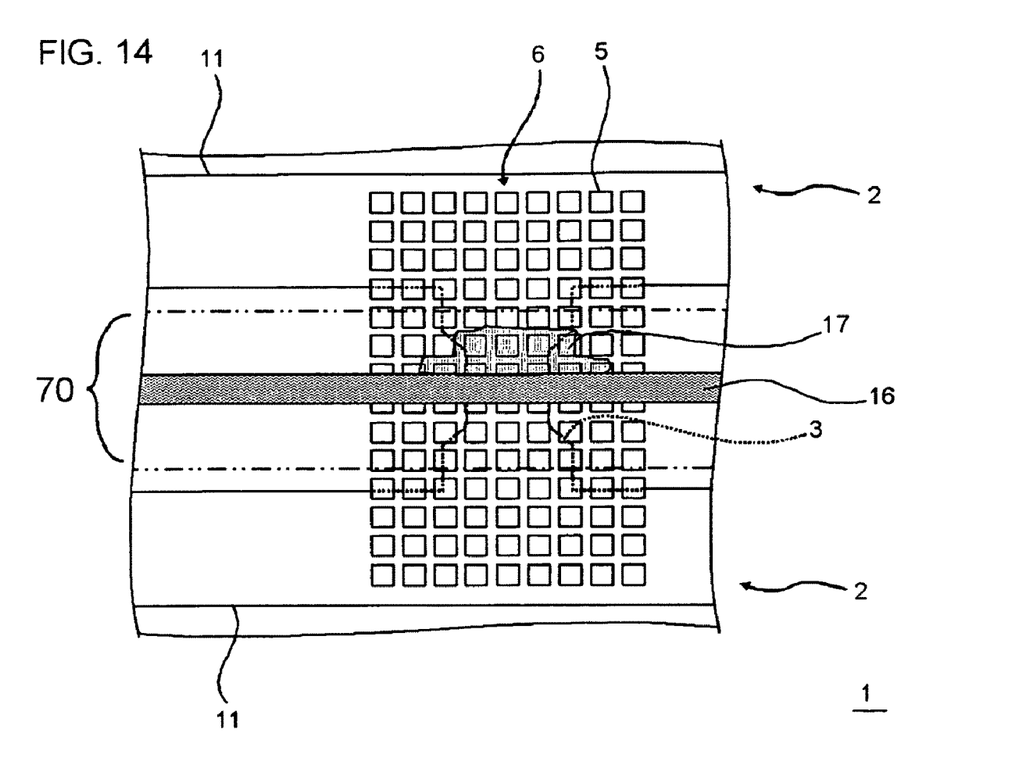
FIG. 14 is a drawing explaining operations of the sixth modified example.

Next, a sixth modified example will be explained. In the sixth modified example, typically as illustrated in FIG. 12, a dummy metal pattern 6 composed of a plurality of dummy metals 5 is formed over the wafer 1. The dummy metal pattern 6 is formed in at least one of the interconnect layers over or below the inter-chip interconnects 3 only in an area corresponded to a region where the inter-chip interconnects 3 are arranged, and corresponded to a region therearound. In the sixth modified example, typically as illustrated in FIG. 13, which is a sectional view taken along line A-A in FIG. 12, the dummy metal pattern 6 is formed in the interconnect layer (surficial interconnect layer 42) above the inter-chip interconnects 3. Again in FIG. 13, the region on the right of the boundary line 4a represents the dicing region 70. Each dummy metal 5 composing the dummy metal pattern 6 may typically have a rectangular plane geometry, or may alternatively have polygonal or still other plane geometry. While the dummy metal pattern 6 composed of a plurality of dummy metals exemplified in FIG. 12 has a matrix-like arrangement, the dummy metals 5 in the dummy metal pattern 6 may alternatively be arranged typically in a staggered manner, without being limited by the illustrated example. The dummy metals 5 may be formed typically by using a metal such as aluminum (Al), but may alternatively be formed using other metals such as copper (Cu). In the process of dicing, the wafer 1 may have chipping 17 produced therein, as indicated by a hatched portion in FIG. 14. The chipping 17 is likely to be produced particularly in and around regions where the inter-chip interconnects 3 are arranged. This is because the inter-chip interconnects 3 and constituents therearound (the first and second insulating interlayers 31, 32, for example) may be curled up (turned over), typically due to entrainment of the inter-chip interconnects 3 under the dicing blade of the dicer. The sixth modified example may successfully suppress spreading of the chipping 17, by virtue of provision of the dummy metal pattern 6 on the wafer 1, by a mechanism explained below. If the chipping 17 should occur in the process of dicing, crack induced by the chipping 17 may spread from the dicing street 16 towards the chip-composing portion 2, but the crack runs against the dummy metals 5 as illustrated in FIG. 14, which successfully prevents the chipping 17 from propagating (spreading). In this way, the chipping 17 may be suppressed from spreading. The dummy metal pattern 6 is arranged, on the upper side of the inter-chip interconnects 3, only in areas corresponded to a region where the inter-chip interconnects 3 are arranged, and to a region therearound. Accordingly, the readiness in dicing may be prevented from degrading due to presence per se of the dummy metals 5, unlike the case where the dummy metal pattern 6 is formed also in the area other than the above-described areas, and thereby the wafer 1 may readily be diced. As has been described in the above, both of suppression of degradation of the readiness in dicing, and suppression of spreading of chipping 17 of the wafer 1 in the process of dicing, may be achieved at the same time.

While the foregoing paragraphs dealt with the cases where the inter-chip interconnects 3 are given as the power lines (where the inter-chip interconnects 3 electrically connect the interconnects 11, given as the power lines, with each other), the inter-chip interconnects 3 may alternatively be given as signal lines (that is, the inter-chip interconnects 3 may electrically connect the interconnects 11 given as the signal lines with each other). In this case, the chip-composing portions 2 may be inspected typically by supplying en bloc signals to the individual chip-composing portions 2 on the wafer 1, sequentially through the inter-chip interconnects 3, after the chip-composing portions 2 are formed on the wafer 1.

While the foregoing paragraphs dealt with the cases where the device isolation is accomplished by the device isolation regions 22 having the STI structure, the device isolation may alternatively be accomplished by the LOCOS (Local Oxidation of Silicon) process. While the foregoing paragraphs dealt with the cases where the inter-chip interconnects 3 and the dummy metals 5 are formed using Al, the inter-chip interconnects 3 and the dummy metal 5 may alternatively be formed using other metals (copper, for example).

It is apparent that the present invention is not limited to the above embodiments, that may be modified and changed without departing from the scope and spirit of the invention.

What is claimed is:

1. A method for manufacturing a semiconductor device, comprising:
    forming a semiconductor wafer comprising a plurality of interconnect layers, the semiconductor wafer including:
        a plurality of chip-composing portions;
        a dicing region separating the chip-composing portions from each other; and
        a plurality of inter-chip interconnects formed in the dicing region and electrically connecting adjacent ones of the chip-composing portions; and
    forming semiconductor chips by dicing the dicing region so as to divide the chip-composing portions,
    wherein each of the inter-chip interconnects has a width of an intermediate portion narrower than widths of connection end portions connected to the adjacent ones of the chip-composing portions.

2. The method for manufacturing a semiconductor device according to claim 1, further comprising:
    applying source voltage to power lines of the chip-composing portions through the inter-chip interconnects, between the forming a semiconductor wafer and the forming semiconductor chips, wherein each of the inter-chip interconnects connects the power lines of adjacent ones of the chip-composing portions sequentially with each other.

3. The method for manufacturing a semiconductor device according to claim 1,
wherein the inter-chip interconnects are composed of aluminum.

4. The method for manufacturing a semiconductor device according to claim 1,
wherein the inter-chip interconnects are formed in the second or deeper interconnect layer among the plurality of interconnect layers, counted from the most surficial interconnect layer.

5. The method for manufacturing a semiconductor device according to claim 1,
wherein a width of the intermediate portion of each of the inter-chip interconnects is narrower by 5 μm or more, as compared with a width of the connection ends portion where the inter-chip interconnect is connected to the chip-composing portions.

6. The method for manufacturing a semiconductor device according to claim 1,
wherein a width of the connection ends where each of the inter-chip interconnects is connected to the chip-composing portions is equal to or larger than 65 μm and equal to or smaller than 80 μm, and
a width of the intermediate portion of the inter-chip interconnect is equal to or larger than 40 μm and equal to or smaller than 60 μm.

7. The method for manufacturing a semiconductor device according to claim 1,
wherein the intermediate portion of each of the inter-chip interconnects has a length of at least 30 μm, in a direction orthogonal to the longitudinal direction of the dicing region.

8. The method for manufacturing a semiconductor device according to claim 1,
wherein the intermediate portion of each of the inter-chip interconnects is positioned at the center of a width of the dicing region.

9. The method for manufacturing a semiconductor device according to claim 1,
wherein, in the forming a semiconductor wafer, a dummy metal pattern composed of a plurality of dummy metals is formed in at least one of the interconnect layers over or below the inter-chip interconnects only in an area corresponded to a region where the inter-chip interconnects are arranged, and corresponded to a region therearound.

* * * * *